(12) United States Patent
Baumgartner et al.

(10) Patent No.: US 7,557,426 B2
(45) Date of Patent: Jul. 7, 2009

(54) INTEGRATED CAPACITOR STRUCTURE

(75) Inventors: Peter Baumgartner, Munich (DE); Phillip Riess, Munich (DE)

(73) Assignee: Infineon Technologies AG, Neubiberg (DE)

( * ) Notice: Subject to any disclaimer, the term of this patent is extended or adjusted under 35 U.S.C. 154(b) by 180 days.

(21) Appl. No.: 11/541,434

(22) Filed: Sep. 29, 2006

(65) Prior Publication Data

US 2008/0079117 A1 Apr. 3, 2008

(30) Foreign Application Priority Data

Sep. 29, 2006 (DE) .................... 10 2005 046 734

(51) Int. Cl.
  *H01G 4/228* (2006.01)
(52) U.S. Cl. ................. 257/532; 257/534; 257/535; 257/E27.048; 257/E27.071; 361/306.1
(58) Field of Classification Search ................ None
  See application file for complete search history.

(56) References Cited

U.S. PATENT DOCUMENTS

| | | | |
|---|---|---|---|
| 5,583,359 A | 12/1996 | Ng et al. | |
| 6,518,604 B1 | 2/2003 | Worley et al. | |
| 6,822,312 B2 | 11/2004 | Sowlati et al. | |
| 2002/0093780 A1 | 7/2002 | Hajiniri et al. | |
| 2004/0223289 A1* | 11/2004 | Kuroda et al. | 361/306.1 |
| 2005/0093094 A1* | 5/2005 | Diorio et al. | 257/532 |
| 2005/0255644 A1* | 11/2005 | Ohkawa | 438/197 |
| 2007/0217122 A1* | 9/2007 | Gevorgian et al. | 361/307 |

FOREIGN PATENT DOCUMENTS

| | | |
|---|---|---|
| EP | 1109227 A2 | 6/2001 |
| GB | 2092374 A | 8/1982 |
| JP | 2003297930 A | 10/2003 |
| WO | WO83/04343 * | 8/1983 |

OTHER PUBLICATIONS

"International Application Serial No. 2005P52907, German Office Action mailed Oct. 25, 2005", 5 pgs.

* cited by examiner

*Primary Examiner*—Minh-Loan T Tran
*Assistant Examiner*—Fei Fei Yeung Lopez
(74) *Attorney, Agent, or Firm*—Schwegman, Lundberg & Woessner, P.A.

(57) ABSTRACT

A semiconductor component including an integrated capacitor structure having at least two groups of at least partly electrically conductive planes and which is patterned in such a way that in at least each group of planes at least one plane has a plurality of strip elements, first strip elements including a first polarity of the capacitor structure and second strip elements including a second polarity of the capacitor structure, the first strip elements together with second strip elements being at least partly interlinked in one another and strip elements of the same polarity at least partly overlapping in at least two planes, the first group of planes being electrically conductively connected by way of vertical connections (vias) to strip elements of the same polarity of the second group of planes, the strip elements of the same polarity of the second group of planes being interconnected with lateral connecting elements.

16 Claims, 6 Drawing Sheets

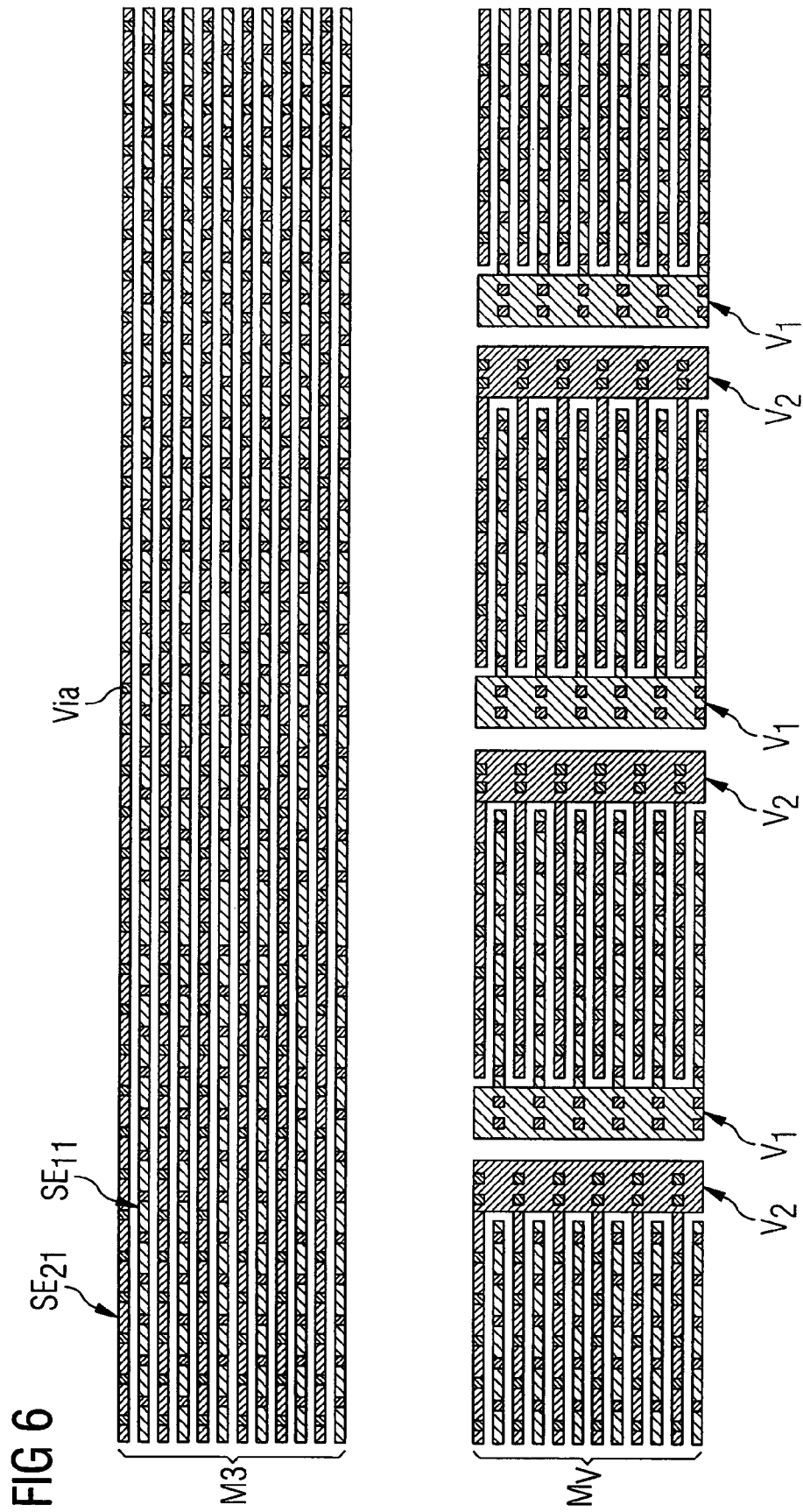

INTEGRATED CAPACITOR STRUCTURE

CLAIM OF PRIORITY

This application claims priority under 35 USC 119 from German Application No. 10 2005 046 734.2, filed Sep. 29, 2005, which application is incorporated herein by reference and made a part hereof.

TECHNICAL FIELD

The subject matter relates generally to apparatus and methods used in connection with electronic circuit elements, including energy storage elements, such as capacitors.

BACKGROUND INFORMATION

Semiconductor circuit technology for the integration of analog circuits generally requires integrated capacitor structures having high fabrication quality and reproducibility with, at the same time, a high capacitance value and a small area requirement. In addition, due to increases in operating frequencies, good radio frequency (RF) properties of integrated capacitor structures may be required.

BRIEF DESCRIPTION OF THE DRAWINGS

FIG. 6 shows an example embodiment of an integrated capacitor structure.

DETAILED DESCRIPTION

Figure 1:
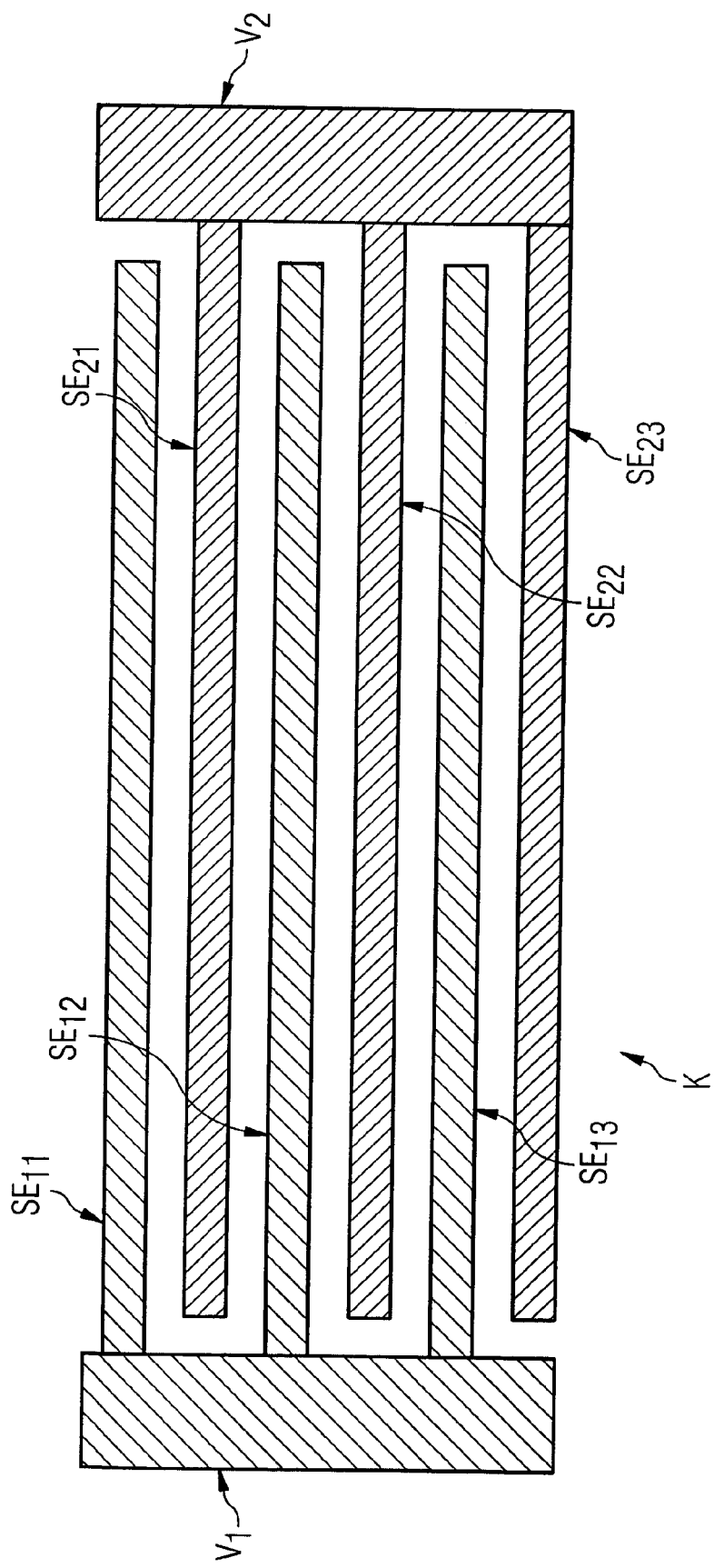
FIG. 1 shows a plan view of an integrated capacitor structure in accordance with the prior art.

FIG. 1 shows in plan view, a layer of an integrated capacitor structure according to the prior art. Over a base substrate, such as a semiconductor substrate (not illustrated), insulating substrates or layers carrying first and second strip elements $SE_{1n}$ and $SE_{2n}$ are regularly interlinked with one another. The capacitance of the arrangement essentially depends both on the length, thickness and number of the strip elements SE and on the distance between the individual strip elements SE. The strip elements are separated from each other by insulating material. Each of the two groups of strip elements $SE_{1n}$ and $SE_{2n}$ is electrically conductively connected to a respective connecting element $V_1$ and $V_2$, arranged laterally. The resulting two comb-shaped structures constitute a capacitor structure having two polarities which function as capacitor plates or terminals. In order to increase the total capacitance, the structure is be repeated a number of times congruently in the vertical direction. In order to make contact with the individual capacitor structures of different planes, at least one respective via is required which connects the conductive elements of the same polarity, but in different planes, to one another.

Thus such known integrated capacitor structures are embodied in a plurality of planes of insulating material above which there are conductive traces that are insulated from one another. The traces are connected into two respective comb structures that constitute the two electrodes or plates of the capacitor structure being repeated in identical form in each plane. The basic area available may not be utilized optimally, however, due to the complete iteration of the comb structures in each plane. That proportion of the comb structures given by the comb bases may not contribute to the effective capacitance. Furthermore, the structure may not enable optimisation with regard to the RF properties.

The example embodiments of the invention described below are merely illustrative. Therefore, those embodiments should not be considered as limiting of the claims.

The term "horizontal", for the purposes of this document, describes a direction which may include, or be parallel to, the substantially planar surface of a base substrate or a circuit board to which electronic components, including capacitors, are mounted. The term "vertical" refers to a direction which is substantially perpendicular to the horizontal direction. If a first element is vertically "above" a second element, it may be either laying directly on that second element or a third element may be interposed between the first and second elements.

Some embodiments may comprise a capacitor having a vertically "stacked" plurality of plates. Terminals may be connected to conductive strip elements on one of the plates along one side of the capacitor structure.

Figure 2:
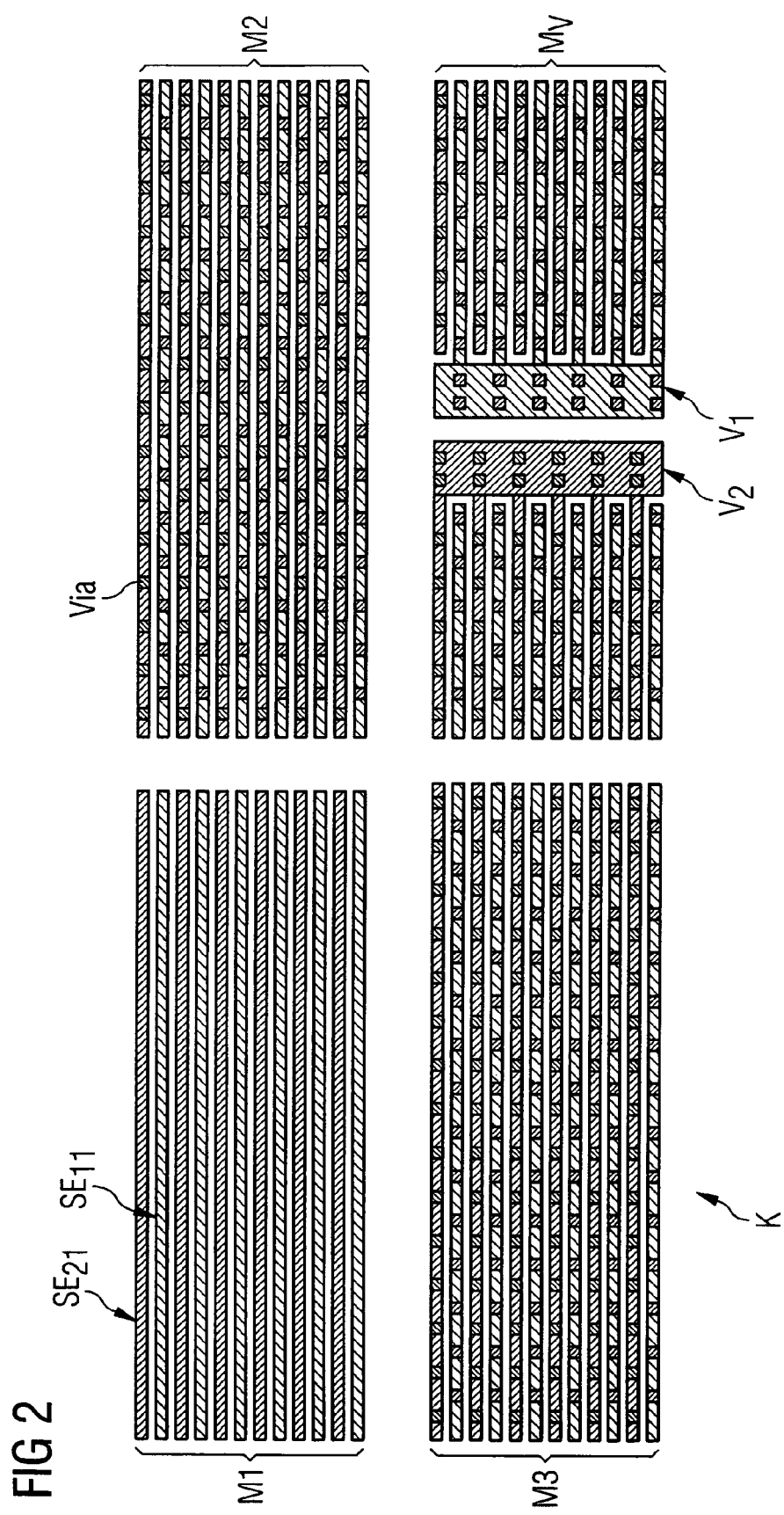
FIG. 2 shows an example embodiment of an integrated capacitor structure, including a total of four planes, one plane being embodied as a connecting plane.

FIG. 2 shows an example embodiment of several layers or planes of an integrated capacitor structure according to some embodiments of the invention. In some embodiments, the electrically conductive planes may be provided by utilizing the metallization planes of the semiconductor component. In some embodiments, metals or metal alloys based on aluminium (Al) or copper (Cu) are used. However, any electrically conductive material is suitable, in principle, for this use.

In some embodiments, the substrate may be doped to create the electrically conductive planes. There are at least two patterning alternatives which differ with regard to the choice of the doping type. In some embodiments, the substrate is doped homogeneously. In order to produce strip elements, the substrate plane is patterned by the strip elements being respectively isolated from one another by an insulating layer. By way of example, the LOCOS (Local Oxidation of Silicon) or STI (Shallow Trench Isolation) methods are employed for insulation purposes. Strip elements of two different polarities are present as a result.

In some other embodiments, the substrate plane may be produced from two different doping types. In these embodiments, the strip elements of the first polarity are produced in a first doping type, while the strip elements of the second polarity are produced in a second doping type. An additional isolation of the respective strip elements from one another, such as by way of separate insulating layers, is unnecessary in these embodiments since a respective junction capacitance is formed between the individual strip elements on account of the pn junction.

In contrast to the prior art, the individual partial capacitor structures are not repeated within the planes M1 to $M_V$. In the lower rewiring planes M1 to M3 as seen from a base or support substrate (not illustrated) there are situated exclusively regularly iterating conductive strip elements of a first and a second polarity $SE_{1n}$ and $SE_{2n}$. Both polarities include a plurality of strip elements SE, which are illustrated by identical hatching in the drawing. In some embodiments strip elements SE are formed in a non-conductive substrate layer and have a thickness in the vertical axis so that they extend into their substrate layer. In some embodiments strip elements SE a formed on a substrate layer and non conductive material is formed over them.

Since increasing the number of strip elements has a purely additive effect, an assignment of reference symbols to all the further strip elements is dispensed with for clarity. It should be clear to a person skilled in the art that a desired capacitance value may be set by choosing relevant parameters, that is to say both length, thickness and number of strip elements and also number of the planes or layers used.

Due to the absence of lateral connecting elements V in the planes M1 to M3 in comparison with the prior art, substantially all of the basic area is available for achieving a high capacitance value. The plane $M_V$, by contrast, is patterned in such a way that two respective lateral connecting elements $V_1$ and $V_2$ are present centrally and they electrically conductively connect the strip elements of the same polarity group in each case laterally to one another.

Non-central arrangements of the connecting elements $V_1$ and $V_2$ are also possible, as will be shown in further implementations of the invention. The central arrangement of some embodiments improves radio frequency properties of the capacitance structure. Charge-reversal currents generated by application of a high-frequency operating voltage within the integrated capacitor structure K run in antiparallel fashion in adjacent strip elements, for example $SE_{1j}$ and $SE_{2j}$. As a result, the generation of undesirable parasitic inductances is largely avoided.

In some embodiments the linking of strip elements of the same group between different planes is effected by way of at least one respective via. For technically simple realization, in some embodiments strip elements of the respective same polarity may be stacked substantially congruently one above another.

In other embodiments, there is only a partial overlap present. Whereas one respective via between the individual strip elements of different planes in each case suffices, in principle, for realizing the implementation, in some embodiments, a plurality of vias is provided. This may increase the contact-connection probability in the fabrication process, which in turn increases the overall yield in component production. Secondly, there is furthermore the additional advantage that embodiments with a plurality of vias make a contribution to the increase in the total capacitance in that they increase the mutually facing vertical areas of different capacitor plates.

For the realization of the some embodiments, it is unimportant whether the group of planes with the connecting elements $V_1$ and $V_2$ are the topmost plane. In particular, the at least one connecting plane V may be realized in embodiments having any desired stack sequence.

Since, on account of fabrication fluctuations, the smallest possible freely selectable spacing of structures (pitch) likewise increases with increasing distance from the substrate, in some embodiments, the at least one connecting plane will actually not be the topmost plane. Rather, even further strip elements SE may be embodied above the at least one connecting plane, the width of the strip elements on account of the design rules for higher planes being greater than that of the strip elements of lower planes. By way of example, in some embodiments, it is possible to periodically omit every second strip element at up to double width.

Figure 3:
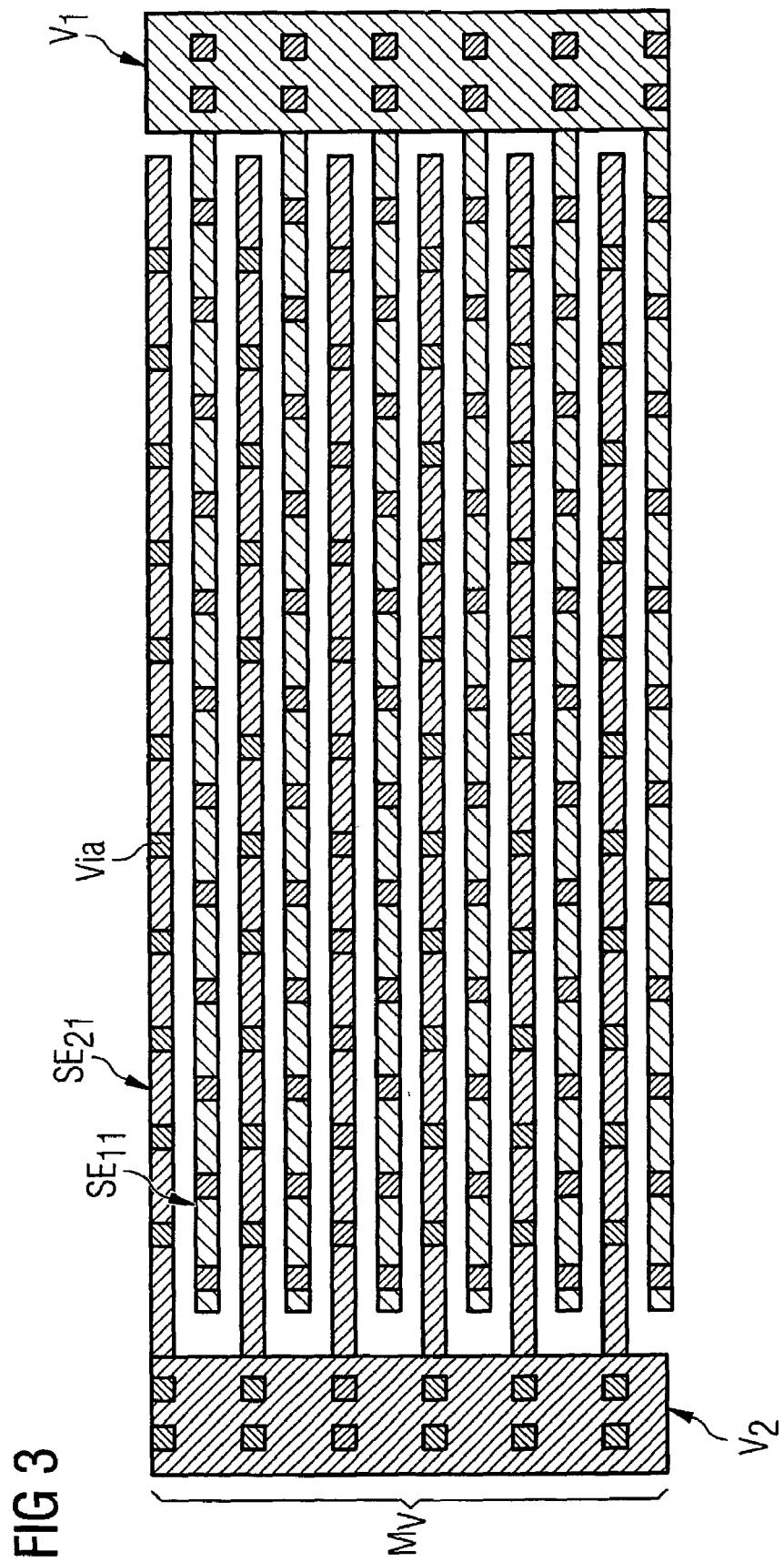
FIG. 3 shows an example embodiment of a connecting plane of an integrated capacitor structure.

FIG. 3 shows an embodiment of the connecting plane $M_V$. A renewed illustration of further planes, for example of the planes M1 and M2 already shown in FIG. 2, is dispensed with in order to simplify the pictorial illustration. In some embodiments, the connecting elements $V_1$ and $V_2$ laterally extend and are arranged at opposite ends of the layer. In the embodiments of FIG. 3, the connecting elements $V_1$ and $V_2$ may be arranged at the outer ends of the strip elements SE in this implementation.

One advantage of embodiments as shown in FIG. 3 is a reduction of the series resistance of the capacitor structure K. A further advantage is that contact may be readily made with the capacitor structure K from above, independently of the widths and spacing of the strip elements SE in some embodiments, by way of differently sized vias. In some embodiments, flexible contact-connection over the entire width of the arrangement, that is to say along the length of the connecting elements V, is likewise possible.

Figure 4:
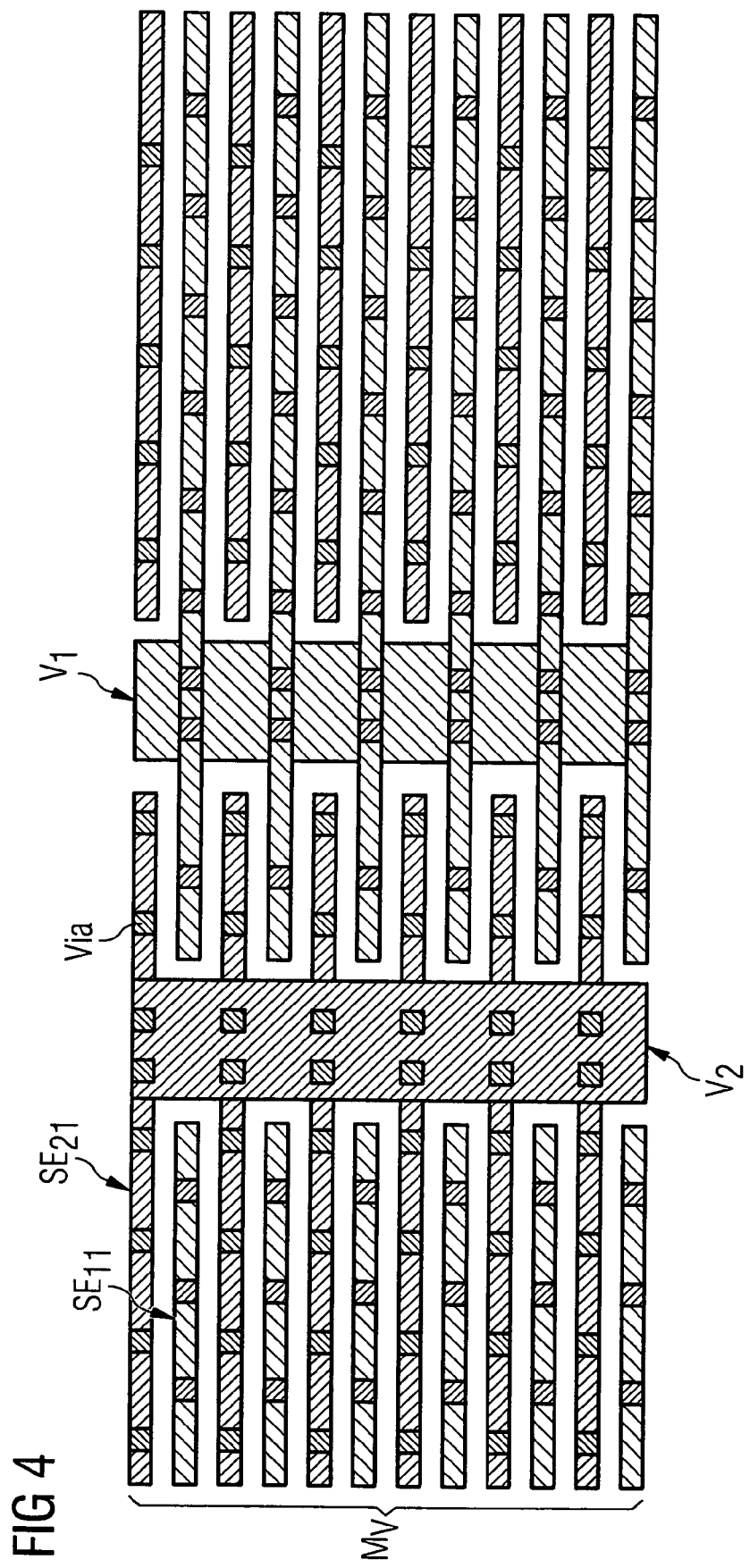
FIG. 4 shows an example embodiment of a connecting plane of an integrated capacitor structure.

FIG. 4 shows an embodiment of the connecting plane $M_V$. A renewed illustration of further planes, for example of the planes M1 and M2 already shown in FIG. 2, is dispensed with in order to simplify the pictorial illustration.

Between the embodiments shown in FIG. 2, where the connecting elements $V_1$ and $V_2$ are arranged centrally, and the embodiments shown in FIG. 3, where the connecting elements $V_1$ and $V_2$ are arranged in the outer positions, a respective intermediate position has been chosen for $V_1$ and $V_2$ in the embodiments shown in FIG. 4.

The lateral displacement of the connecting elements along the strip elements SE affords a flexible contact-connection possibility, which in turn results in improved adaptation to other circuit sections.

Figure 5:
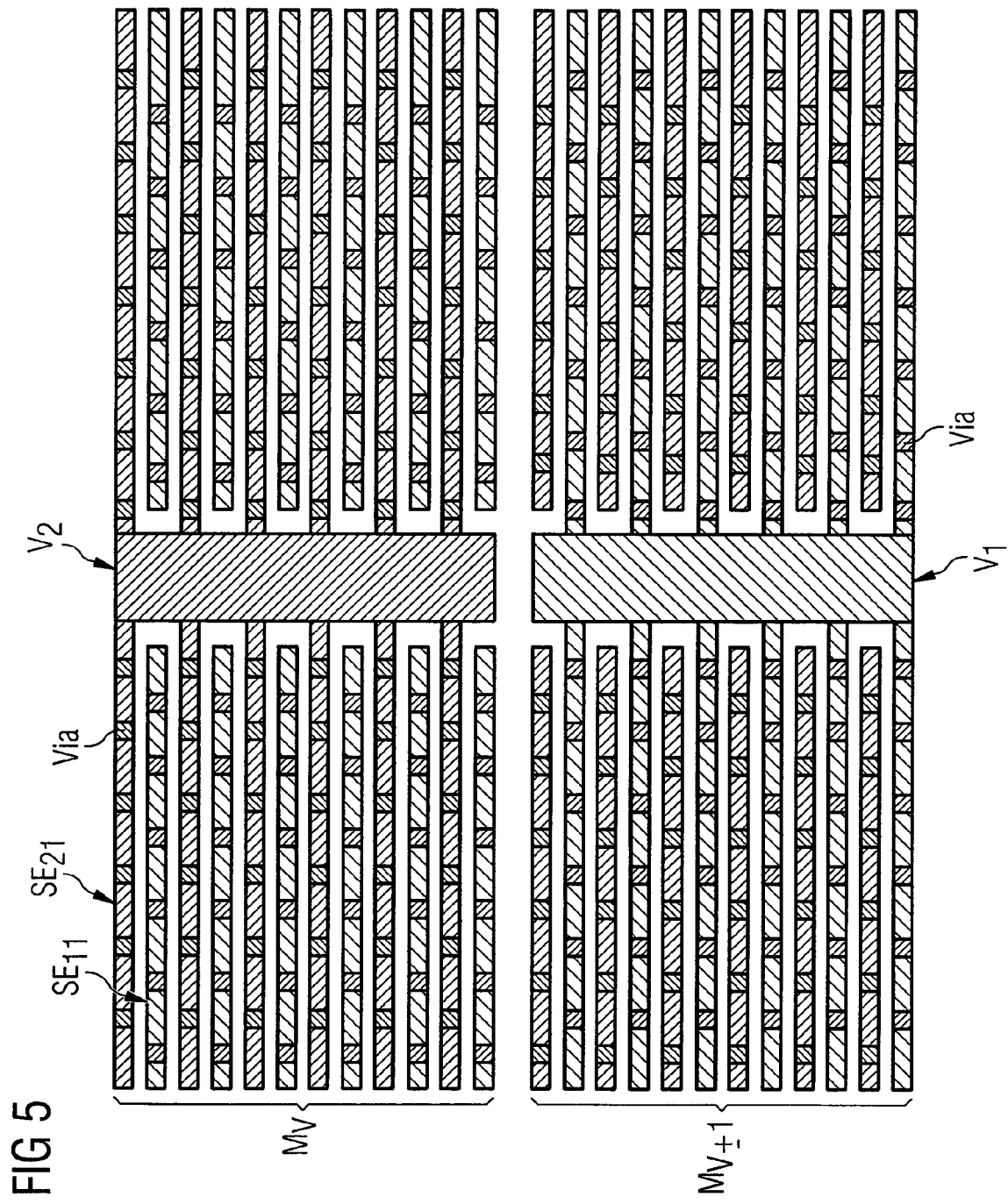
FIG. 5 shows an example embodiment of an integrated capacitor structure, two connecting planes being present.

FIG. 5 shows an embodiment of an integrated capacitor structure. A renewed illustration of further planes, for example of the planes M1 and M2 already shown in FIG. 2, is dispensed with for the purpose of simplification.

In contrast to embodiments discussed above, in some embodiments shown in FIG. 5, functionality of the lateral connection is distributed between two planes. In the plane $M_V$, a lateral electrically conductive connection between the strip elements of the second polarity $SE_{2n}$ may be produced by way of connecting element $V_2$. In the plane $M_{V\pm1}$, that is to say a plane which is situated for example directly below or directly above the plane $M_V$, a lateral electrically conductive connection between the strip elements of the first polarity $SE_{1n}$ may be produced by way of connecting element $V_1$.

One advantage of the embodiments shown in FIG. 5 is that extensive compensation of the magnetic leakage fields is obtained. This may result in a reduction of the parasitic inductance of the capacitor structure. Furthermore, in embodiments such as those shown in FIG. 5 employing adjacent vertical arrangement of the connecting elements $V_1$ and $V_2$, it is also possible to utilize a contribution to the total capacitance from their resultant vertical capacitance with respect to one another.

Embodiments in which the two connecting planes, that is to say planes of the second group of planes, are situated in any desired vertical stack sequence are also possible. It is thus possible, by way of example, to vertically isolate from one another the two connecting planes from at least one plane from the first group of strip elements SE where no lateral connections of the strip elements are present.

FIG. 6 shows an embodiment of an integrated capacitor structure. A renewed illustration of further planes, for example of the planes M1 and M2 already shown in FIG. 2, is dispensed with for simplification purposes.

In the embodiments illustrated in FIG. 6, the lateral, geometrical extent of the capacitor structure along the strip elements SE may be greater than the lateral extent perpendicular thereto. In order to minimize the non-reactive resistance of the capacitor structure in these embodiments, a multiplicity of first and second connecting elements $V_1$ and $V_2$ which are connected in parallel fashion are provided.

CONCLUSION

In some embodiments, the individual lengths, widths and thicknesses of the individual strip elements may be flexibly adapted in most and/or all the planes and groups. The respective geometry of the strip elements is thus adapted to the requirements of the respective plane and group. Thus, in some embodiments, the structure widths and structure spacing of the strip elements in higher wiring planes is larger than the structure dimensions in lower wiring planes for technical fabrication reasons.

In some embodiments capacitance may be increased if the arrangement of the strip elements in a first group of planes is periodically repeated. This often reduces the proportion of the structures which is not effective for the calculation of the useful capacitance, that is to say the area proportion of the connecting elements, relative to the total useful area. In this case, the total useful area is to be understood to mean the summational area proportion of all most and/or the planes available for the capacitor structure.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. A semiconductor component comprising:
an integrated capacitor structure being embodied in at least two groups of at least partly electrically conductive planes and which is patterned in such a way that in at least each group of planes at least one plane has a plurality of strip elements, first strip elements including a first polarity of the capacitor structure and second strip elements including a second polarity of the capacitor structure, the first strip elements together with the second strip elements being at least partly interlinked in one another and strip elements of the same polarity at least partly overlapping in at least two planes, wherein the strip elements of the first group of planes are electrically conductively connected by way of vertical connections to strip elements of the same polarity of the second group of planes, wherein strip elements of the same polarity of the second group of planes are interconnected with lateral connecting elements, wherein at least one outermost plane forming the capacitor includes a plurality of strip elements, and wherein at least one of the electrically conductive planes is a doped plane of a semiconductor substrate and includes the strip elements of the first polarity in a first doping type thereof and the strip elements of the second polarity in a second doping type thereof.

2. A semiconductor component according to claim 1, wherein the lateral connecting elements connect the strip elements of a respective polarity to one another at ends thereof.

3. A semiconductor component according to claim 1, wherein the lateral connecting elements connect the strip elements of a respective polarity to one another centrally.

4. A semiconductor component according to claim 1, wherein the charge-reversal currents in two adjacent strip elements of different polarities flow in opposite directions at least in one partial region.

5. A semiconductor component according to claim 1, wherein the first group of strip elements is present in substantially identical form in at least two planes.

6. A semiconductor component according to claim 1, wherein at least one of the electrically conductive planes is a metallization plane of the semiconductor component.

7. A semiconductor component according to claim 1, wherein at least one of the electrically conductive planes includes polysilicon.

8. A semiconductor component according to claim 1, wherein at least one of the electrically conductive planes is a doped plane of a semiconductor substrate.

9. A semiconductor component according to claim 8, wherein at least one doped plane of the semiconductor substrate is embodied in at least one doping type, the strip elements of the first polarity being mutually isolated from the strip elements of the second polarity by way of a respective vertical insulating layer.

10. A capacitive device comprising:
a first plane of multiple conductive strip elements that are separated from each other by a dielectric;
a second plane of multiple conductive strip elements that are separated from each other by a dielectric and are arranged substantially beneath corresponding conductive strip elements of the first plane;
a plurality of vias connecting conductive strip elements in the first plane with corresponding conductive strip elements in the second plane;

a first lateral connector disposed in one of the first and second planes of conductive strip elements to couple conductive strips of a first capacitive polarity to each other; and a second lateral connector disposed in one of the first and second planes of conductive strip elements, electrically isolated from the first lateral connector, to couple conductive strips of a second capacitive polarity to each other, wherein at least one of the first and second planes of multiple conductive strip elements is a doped plane of a semiconductor substrate and includes the strip elements of the first capacitive polarity in a first doping type thereof and the strip elements of the second capacitive polarity in a second doping type thereof.

11. The device of claim 10 wherein the first and second lateral connectors are disposed on the same plane of conductive strip elements.

12. The device of claim 11 wherein the first and second lateral connectors are adjacent to each other proximate a middle of the first plane.

13. The device of claim 11 wherein the first and second lateral connectors are on opposite ends of the first plane.

14. The device of claim 10 wherein the first and second lateral connectors are disposed on the first and second planes respectively and vertically oriented from each other to provide additional capacitance.

15. The device of claim 14 wherein additional planes of multiple conductive strips are added on either side of the first and second planes of multiple conductive strips.

16. The device of claim 10 and further comprising at least one additional plane of multiple conductive strip elements coupled to corresponding strip elements of the first and second planes to increase the capacitance of the device.

* * * * *

UNITED STATES PATENT AND TRADEMARK OFFICE
CERTIFICATE OF CORRECTION

PATENT NO. : 7,557,426 B2  Page 1 of 1
APPLICATION NO. : 11/541434
DATED : July 7, 2009
INVENTOR(S) : Baumgartner et al.

It is certified that error appears in the above-identified patent and that said Letters Patent is hereby corrected as shown below:

Title page, Item (30), "Foreign Application Priority Data", delete "Sep. 29, 2006" and insert
-- Sep. 29, 2005 --, therefor.

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,557,426 B2 Page 1 of 1
APPLICATION NO. : 11/541434
DATED : July 7, 2009
INVENTOR(S) : Baumgartner et al.

It is certified that error appears in the above-identified patent and that said Letters Patent is hereby corrected as shown below:

On the Title page, in field (75), in "Inventors", in column 1, line 2, delete "Phillip" and insert -- Philipp --, therefor.

Signed and Sealed this

Twenty-third Day of March, 2010

David J. Kappos
*Director of the United States Patent and Trademark Office*